United States Patent
Hwang

(10) Patent No.: US 8,644,106 B2
(45) Date of Patent: Feb. 4, 2014

(54) SHIFT CIRCUIT OF A SEMICONDUCTOR DEVICE

(75) Inventor: Jeong-Tae Hwang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 190 days.

(21) Appl. No.: 13/220,983

(22) Filed: Aug. 30, 2011

(65) Prior Publication Data

US 2012/0051172 A1     Mar. 1, 2012

(30) Foreign Application Priority Data

Aug. 30, 2010   (KR) .................. 10-2010-0083869

(51) Int. Cl.
   *G11C 8/00*   (2006.01)

(52) U.S. Cl.
   USPC .............. 365/233.1; 365/233.11; 365/233.13; 365/189.05

(58) Field of Classification Search
   USPC ................ 365/233.1, 233.11, 233.12, 189.05
   See application file for complete search history.

(56) References Cited

U.S. PATENT DOCUMENTS 6,061,418 A * 5/2000 Hassoun .......................... 377/47
7,742,359 B2 * 6/2010 Nam .......................... 365/230.08

* cited by examiner

*Primary Examiner* — Son Dinh

(74) *Attorney, Agent, or Firm* — IP & T Group LLP

(57) ABSTRACT

A shift circuit of a semiconductor device reduces the power consumption of the semiconductor device. The shift circuit comprises a plurality of shifters and a plurality of clock controllers. The plurality of shifters shifts an input signal in sequence in response to a clock. The plurality of clock each supply the clock to a corresponding shifter before an input of the corresponding shifter is activated and stop the supply of the clock to the corresponding shifter when an output of the corresponding shifter is activated.

10 Claims, 3 Drawing Sheets

SHIFT CIRCUIT OF A SEMICONDUCTOR DEVICE

CROSS-REFERENCE TO RELATED APPLICATIONS

The present application claims priority of Korean Patent Application No. 10-2010-0083869, filed on Aug. 30, 2010, which is incorporated herein by reference in its entirety.

BACKGROUND

1. Field

Exemplary embodiments of the present invention relate to a semiconductor memory device, and more particularly, to a shift circuit of the semiconductor memory device.

2. Description of the Related Art

While there is a need to increase the integration degree of semiconductors, it is also desirable to increase their operation speeds. Available high-speed synchronous memories are synchronous dynamic random access memory (DRAM), double data rate (DDR) synchronous DRAM (SDRAM), RAMBUS DRAM, etc.

Here, a synchronous memory denotes a memory synchronized with an external system clock in operation. For example, a SDRAM operates in synchronization with a rising edge of a clock to allow one data input/output in response to each clock cycle. DDR SDRAM operates in synchronization with a falling edge as well as a rising edge of a clock to allow two data input/output in response to each clock cycle.

Generally, various operation timings are set for smooth data transmission in a semiconductor memory device such as a DDR SDRAM. According to an example of an operation timing, a write latency (WL) denotes a timing in which data inputs after a write command inputs. The write latency is based on a period of an external clock signal. Here, when the write latency is 4, data is inputted after four clock cycles from the time that the write command is applied.

According to another example of an operation timing in a semiconductor memory device, an additive latency (AL) is used. Here, when AL is not defined and an active signal is applied, read/write commands are applied after a time equal to tRCD passes from the input of the active signal. Here, tRCD denotes random address strobe (RAS) to column address strobe (CAS) delay. When AL is defined, the read/write commands can be applied before tRCD passes from the time that an RAS is applied. If AL is 2, the read/write commands in some circumstances may be applied 2 clock cycles before applying the read/write commands. Use of AL increases the utilization efficiency of data buses.

In case that a memory uses AL, a read latency (RL) is to be the sum of AL and column address strobe (CAS) latency (CL). Here, CL is the time from input of the read command to output of data in response to the read command.

As described above, in order to input/output data after the input of the application of read/write commands with appropriate delays, the applied read/write commands are to be shifted (that is, delayed) for an appropriate number of times corresponding to the delays. Here, the read/write commands are shifted until they are ready to be applied for input/output of data in response to the applied read/write commands. Here, in shifting write/read commands, a mode resister set (MRS) stores information as to how many times applied read/write commands are to be shifted. In response to the information stored in the MRS, a shift circuit shifts the applied read/write commands.

The shift circuit shifts and outputs input address as well as input commands in response to the information stored in the MRS. The structure and operation of a conventional shift circuit are as follows.

FIG. 1 illustrates a block diagram of a conventional shift circuit of a semiconductor device.

As can be seen from FIG. 1, a shift circuit includes a plurality of shifters 101-110 connected in series. Each of the shifters receives and shifts its input signal in response to a clock CLK.

In illustrating operations of the FIG. 1 circuit, consider the following situation where the number of the plurality of shifters 101, 102 and 110 in the shift circuit is 10, an input signal IN is a write command, and a write latency set by the MRS is 7. Since the write latency is 7, the shift circuit shifts and outputs the write command for 7 clock cycles. Here, a command is a signal with a pulse duration of 1 clock cycle or a half clock cycle, where the write command is a signal with a pulse duration of 1 clock cycle. The plurality of shifters 101-110 may each be a D-type flip-flop that delays and outputs its input after one clock cycle. A reset signal RST indicates a signal to reset the plurality of shifters 101-110.

When the write command is received as input signal IN, a first shifter 101 shifts the write command by one clock cycle and generates the shifted write command as a first positive output QR1 in response to the clock CLK. A second shifter 102 shifts the first positive output QR1 by one clock cycle and generates the shifted first positive output QR1 as a second positive output QR2 in response to the clock CLK. In the same way, each of shifters 103-110 shifts its input signal by one clock cycle and generates a shifted output in response to the clock CLK. Thus, the first to tenth shift circuits 101-110 each shift and generate the input write command by 1 clock cycle. Since the write latency is 7, data is outputted in response to a positive output QR7 of a seventh shifter 107 (not shown).

Alternatively, a negative output QF7 of the seventh shifter 107 may be used for controlling the data output. Delay values of negative outputs QF1-QF10 are smaller than 1 clock cycle compared to a corresponding input of the respective shifter and have a phase that is the inverse of the input signal IN.

It may be useful to have each of the shifters to operate, for example, only while its input signal is inputted, shifted and outputted and still allow some margins for the operation. However, the conventional shift circuit provides the clock CLK to all of the shifters 101-110. Thus, current flowing in the shift circuit and power consumption may unnecessarily increase.

SUMMARY

Exemplary embodiment of the invention is directed to a shift circuit of a semiconductor device which reduces the power consumption.

In accordance with an exemplary embodiment of the invention, a shift circuit comprises a plurality of shifters configured to shift an input signal in sequence in response to a clock; and a plurality of clock controllers configured to each supply the clock to a corresponding shifter before an input of the corresponding shifter is activated and stop the supply of the clock to the corresponding shifter when an output of the corresponding shifter is activated.

In accordance with another exemplary embodiment of the invention, a plurality of shifters configured to shift an input signal in sequence through the shifters; and a plurality of clock controllers configured to each receive output signals of a first one and a second one of the shifters and supply a clock to a corresponding one of the shifters in response to an output signal of one of the first and second shifters and stop the supply of the clock in response to an output signal of the other one of the first and second shifters.

DETAILED DESCRIPTION

Figure 1:
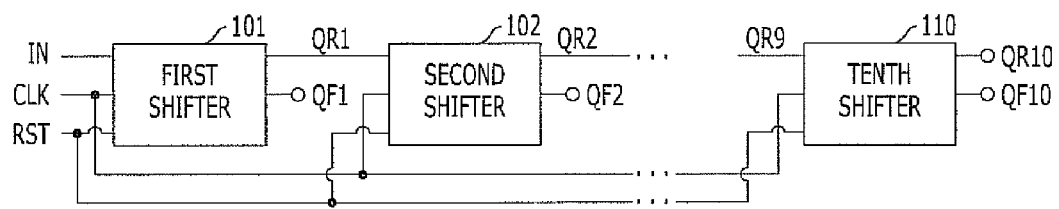
FIG. 1 illustrates a block diagram of a conventional shift circuit in a semiconductor device.

Exemplary embodiments of the invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments.

Figure 2:
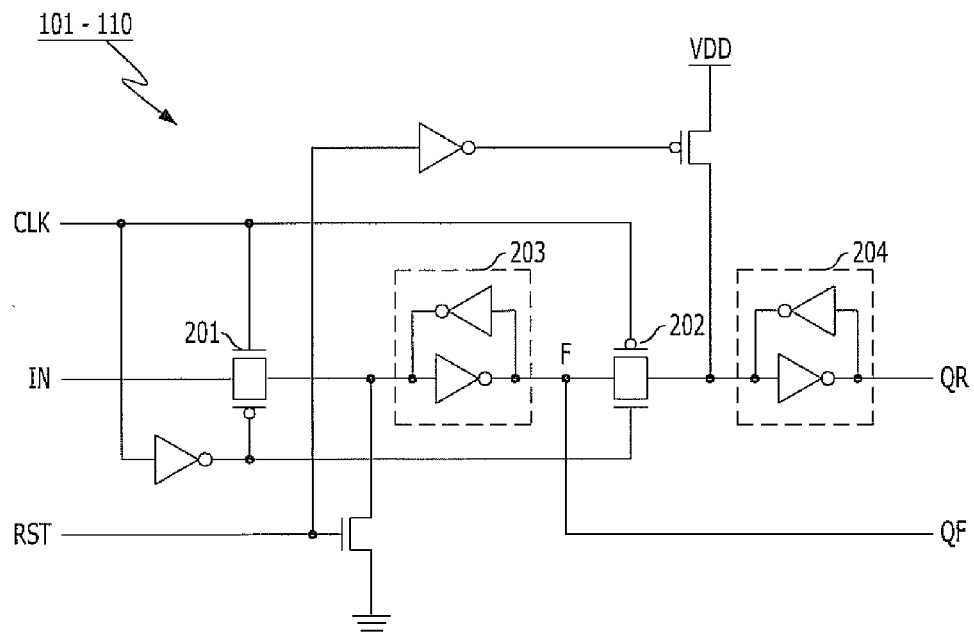
FIG. 2 illustrates a detailed circuit diagram of the shifters shown in FIG. 1.

FIG. 2 illustrates a detailed circuit diagram of a shifter useable as, for example, the shifters 101-110 shown in FIG. 1.

The shifters 101-110 may be embodied by a typical D-type flip-flop. D-type flip-flop includes a first pass gate 201, a second pass gate 202, a first latch circuit 203 and a second latch circuit 204. The first pass gate 201 transfers an input signal IN in response to a clock CLK. The second pass gate 202 transfers a negative output QF in response to the clock CLK. The first latch circuit 203 latches or stores the input signal IN transferred through the first pass gate 201. The second latch circuit 204 latches or stores the negative output QF transferred through the second pass gate 202. VDD is a power supply voltage.

Figure 3:
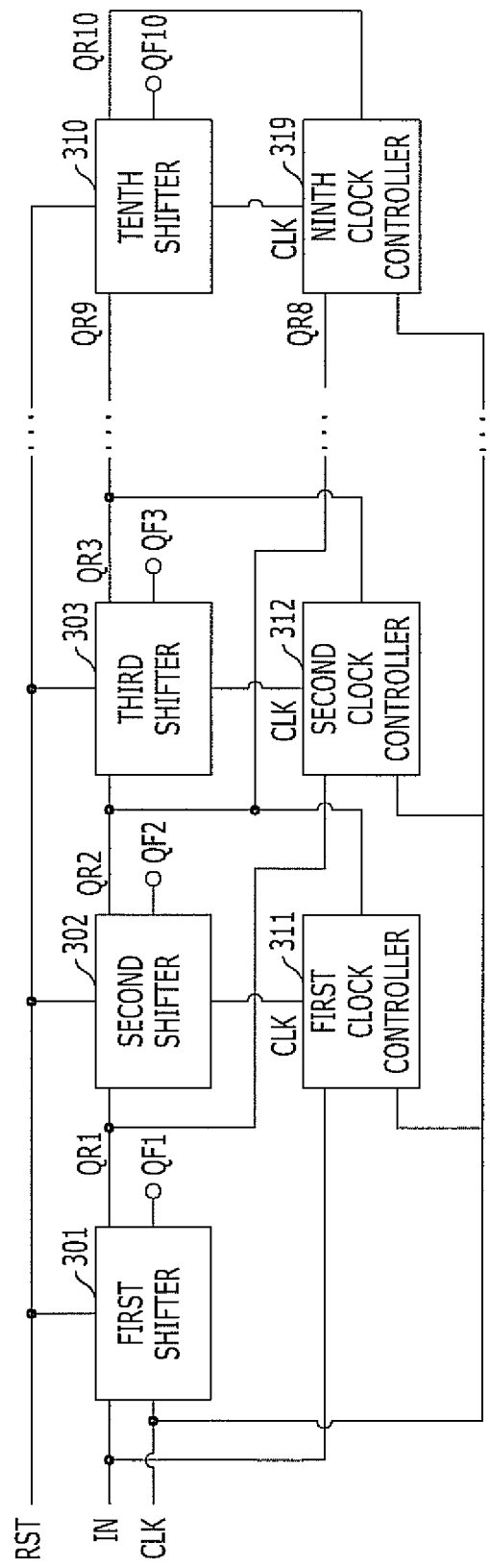
FIG. 3 illustrates a block diagram of a shift circuit in a semiconductor device in accordance with an embodiment of the invention.

FIG. 3 illustrates a block diagram of a shift circuit in a semiconductor device in accordance with an exemplary embodiment of the invention.

As shown in FIG. 3, the shift circuit includes a plurality of shifters 301-310 and a plurality of clock controllers 311-319. The plurality of shifters 301-310 shift an input signal in sequence in response to a clock CLK. According to an example, the plurality of clock controllers 311-319 may be included in one or more of the plurality of shifters 301-310. The plurality of clock controllers 311-319 provide/supply the clock CLK to each of the shifters 302-310 before the input signal (QR1-QR9) of the corresponding shifter is activated until the output (QR2-QR10) of the corresponding shifter (302-310) is activated.

In FIG. 3, the plurality of clock controllers 311-319 are shown to correspond to the plurality of shifters 302-310, respectively.

The configuration shown in FIG. 3 is exemplary only and other configurations where a plurality of clock controllers are assigned to some of the shifters 301-310 may also be used. In the above-described configurations including the configuration shown in FIG. 3, the plurality of clock controllers 311-319 may each provide the clock CLK to the corresponding shifter at a time before the input signal (QR1-QR9) of the corresponding shifter is activated. According to another example, the plurality of clock controllers 311-319 may each receive a negative output (QF2-QF10) of a shifter prior to a shifter corresponding to the clock controller and provide the clock CLK to a corresponding shifter (302-310) in response to the negative output.

The plurality of clock controllers (311-319) each provide the clock CLK to the corresponding shifter (302-310) when the input of a shifter prior to a corresponding shifter of the clock controller is activated and stop the provision of the clock CLK to the corresponding shifter (302-310) when the output (QR2-QR10) of the corresponding shifter is activated. The input signal IN may be a pulse signal having a desired pulse width.

For purposes of illustration, the operation of the shift circuit where the input signal IN is a write command and a write latency set by MRS is 5 is described. Here, the command may be a signal having a pulse width equal to 1 clock cycle or a half clock cycle. A reset signal RST resets the plurality of shifters 301-310.

First, a write command is input as input signal IN to the first shifter 301 and the first clock controller 311, simultaneously. When the write command is input, the first shifter 301 shifts/delays the input signal IN by 1 clock cycle and generates the shifted input signal as a first positive output QR1. The first clock controller 311 is activated when the write command is inputted as input signal IN. In response to the input signal IN, the first clock controller 311 provides the clock CLK to the corresponding second shifter 302. The second shifter 302 receives the first positive output QR1, shifts (that is, delays) the first positive output QR1 by 1 clock cycle, and generates the shifted positive output QR1 as a second positive output QR2, in response to the clock CLK. When the second positive output QR2 is activated, the first clock controller 311 stops the provision of the clock CLK to the corresponding second shifter 302.

When the first positive output QR1 of the first shifter 301 is input, the second clock controller 312 supplies the clock CLK to the corresponding third shifter 303. The third shifter 303 receives the second positive output QR2, shifts the second positive output QR2 by 1 clock cycle, and generates the shifted positive output QR2 as a third positive output QR3, in response to the clock CLK. When the third positive output QR3 is activated, the second clock controller 312 stops the provision/supply of the clock CLK to the corresponding third shifter 303.

In the same manner, the subsequent shifters and clock controllers operate. Here, the clock CLK is not provided to a shifter that does not perform a shift operation. Thus, the current flowing in the shift circuit and the power consumption thereof are reduced.

When negative outputs are used as inputs of clock controllers instead of using positive outputs of the shifter, the operation remains the same except for the fact that the negative outputs (QF2-QF10) are used and the clock CLK is provided to corresponding shifters at timing points earlier than when input signals of the corresponding shifters are received by the shifters.

While the plurality of shifters 301-310 may be embodied by a D-type flip-flop, such a configuration is exemplary only and any reasonably suitable shifter that receives an input signal, shifts the input signal and outputs the shifted input signal may be used for the shifters 301-310.

Figure 4:
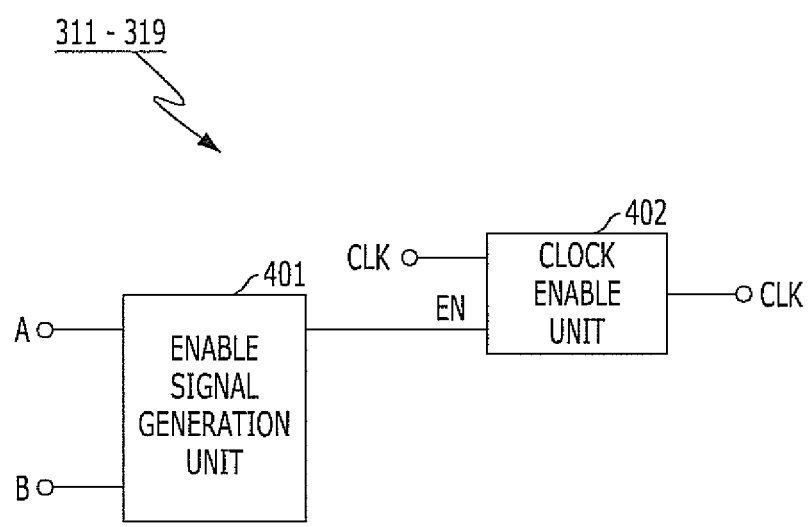
FIG. 4 illustrates a detailed block diagram of the clock controllers shown in FIG. 3.

FIG. 4 illustrates a detailed block diagram of the plurality of clock controllers 311-319 shown in FIG. 3.

As shown in FIG. 4, the plurality of clock controllers 311-319 each include an enable signal generation unit 401 and a clock enable unit 402. The enable signal generation unit 401 activates an enable signal EN when the input of a designated shifter prior to the corresponding shifter is activated and deactivates the enable signal EN when the output of the corresponding shifter is activated. The clock enable unit 402 transfers the clock CLK when the enable signal EN is activated and do not transfer the clock CLK when the enable signal EN is deactivated.

The enable signal generation unit 401 includes a first input A and a second input B. The first input A receives an input of a designated shifter (which is output from a shifter) prior to the corresponding shifter to activate the enable signal EN. The second input B receives an output of the corresponding shifter to deactivate the enable signal EN.

When the input of the designated shifter prior to the corresponding shifter is activated, the enable signal EN is activated by the enable signal generation unit 401. When the enable signal EN is activated, the clock enable unit 402 transfers the clock CLK, When the output of the corresponding shifter is activated, the enable signal EN is deactivated by the enable signal generation unit 401. When the enable signal EN is deactivated, the clock enable unit 402 does not transfer the clock CLK.

Here, the enable signal generation unit 401 may be implemented by a RS latch or any other reasonably suitable circuit that performs the above described functions of the enable signal generation unit 401. When the enable signal generation unit 401 is an RS latch, the first input A is a SET input, the second input B is a RESET input, and the output signal of the RS latch is an enable signal EN.

While the present invention has been described with respect to the specific embodiments, it will be apparent to those skilled in the art that various changes and modifications may be made without departing from the spirit and scope of the invention as defined in the following claims.

What is claimed is:

1. A shift circuit of a semiconductor device, comprising:
a plurality of shifters configured to shift an input signal in sequence in response to a clock; and
a plurality of clock controllers configured to each supply the clock to a corresponding shifter before an input of the corresponding shifter is activated and stop the supply of the clock to the corresponding shifter when an output of the corresponding shifter is activated.

2. The shift circuit of claim 1, wherein the plurality of clock controllers are each configured to supply the clock to the corresponding shifter when an input of a designated shifter prior to the corresponding shifter is activated and stop the supply of the clock to the corresponding shifter when the output of the corresponding shifter is activated.

3. The shift circuit of claim 1, wherein the input signal is a pulse signal.

4. The shift circuit of claim 1, wherein the plurality of shifters each include a D-type flip-flop.

5. The shift circuit of claim 1, wherein the plurality of clock controllers each comprises:
an enable signal generation unit configured to activate an enable signal when the input of the designated shifter prior to the corresponding shifter is activated and deactivate the enable signal when the output of the corresponding shifter is activated; and
a clock enable unit configured to transfer the clock when the enable signal is activated and not transfer the clock when the enable signal is deactivated.

6. The shift circuit of claim 5, wherein the enable signal generation unit includes an RS latch.

7. A shift circuit of a semiconductor device, comprising:
a plurality of shifters configured to shift an input signal in sequence through the shifters; and
a plurality of clock controllers configured to each receive output signals of a first one and a second one of the shifters and supply a clock to a corresponding one of the shifters in response to an output signal of one of the first and second shifters and stop the supply of the clock in response to an output signal of the other one of the first and second shifters.

8. The shift circuit of claim 7, wherein the plurality of clock controllers are each configured to supply the clock to the corresponding shifter before the input signal is shifted and input to the corresponding shifter and stop the supply of the clock when the input signal is output from the corresponding shifter.

9. The shift circuit of claim 7, wherein the plurality of clock controllers each include an RS latch that receive the output signals of the first and second shifters as inputs and a clock enable unit that receive an output of the RS latch as an input to control a supply of the clock signal.

10. The shift circuit of claim 7, wherein the plurality of shifters each have a positive output node for outputting the input signal and a negative output node for outputting an inverse of the input signal and the plurality of clock controllers are each coupled to receive an output of the negative output node of a shifter of the first and second shifters.

* * * * *